(12) United States Patent
Petitprez

(10) Patent No.: US 9,922,871 B2
(45) Date of Patent: Mar. 20, 2018

(54) PROCESS FOR PRODUCING A CONTACT ON AN ACTIVE ZONE OF AN INTEGRATED CIRCUIT, FOR EXAMPLE PRODUCED ON AN SOI SUBSTRATE, IN PARTICULAR AN FDSOI SUBSTRATE, AND CORRESPONDING INTEGRATED CIRCUIT

(71) Applicant: STMicroelectronics (Crolles 2) SAS, Crolles (FR)

(72) Inventor: Emmanuel Petitprez, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/401,896

(22) Filed: Jan. 9, 2017

(65) Prior Publication Data
US 2017/0117178 A1   Apr. 27, 2017

Related U.S. Application Data

(62) Division of application No. 14/962,976, filed on Dec. 8, 2015, now Pat. No. 9,590,064.

(30) Foreign Application Priority Data

Jun. 18, 2015   (FR) ...................... 15 55588

(51) Int. Cl.
*H01L 21/768* (2006.01)
*H01L 29/78* (2006.01)
(Continued)

(52) U.S. Cl.
CPC .. *H01L 21/76832* (2013.01); *H01L 21/76805* (2013.01); *H01L 21/76895* (2013.01);
(Continued)

(58) Field of Classification Search
CPC ....... H01L 29/42364; H01L 21/823475; H01L 21/76835; H01L 29/518; H01L 21/76816; H01L 21/84; H01L 29/0649; H01L 21/283
See application file for complete search history.

(56) References Cited

U.S. PATENT DOCUMENTS 8,987,070 B2   3/2015   Cheng et al.
2011/0042752 A1   2/2011   Mayuzumi
(Continued)

FOREIGN PATENT DOCUMENTS

DE   102011004322 A1   8/2012

OTHER PUBLICATIONS

INPI Search Report and Written Opinion for FR 1555588 dated Apr. 19, 2016 (7 pages).
(Continued)

*Primary Examiner* — David Vu
(74) *Attorney, Agent, or Firm* — Gardere Wynne Sewell LLP

(57) ABSTRACT

An integrated circuit includes an active zone lying above a semiconductor substrate. A cavity borders the active zone and extends, in an insulating zone, as far as into the vicinity of a semiconductor region. An insulating multilayer is provided and an electrically conductive contact extends within the insulating multilayer to emerge onto the active zone and into the cavity. The insulating multilayer includes a first insulating layer covering the active zone outside the contact and lining the walls of the cavity. An additional insulating layer covers the portion of the first insulating layer lining the walls of the cavity. The contact reaches the additional insulating layer in the cavity. An insulating region lies on top of the first insulating layer and the additional insulating layer made from insulating material around the contact.

16 Claims, 8 Drawing Sheets

(51) Int. Cl.
    *H01L 29/06*     (2006.01)
    *H01L 29/08*     (2006.01)
    *H01L 29/45*     (2006.01)
    *H01L 23/535*     (2006.01)
    *H01L 23/532*     (2006.01)

(52) U.S. Cl.
    CPC ...... *H01L 23/535* (2013.01); *H01L 23/53295* (2013.01); *H01L 29/0649* (2013.01); *H01L 29/0847* (2013.01); *H01L 29/45* (2013.01); *H01L 29/7838* (2013.01)

(56) References Cited

U.S. PATENT DOCUMENTS

| | | |
|---|---|---|
| 2013/0026570 A1 | 1/2013 | Fan et al. |
| 2013/0175622 A1 | 7/2013 | Haran et al. |
| 2014/0051239 A1 | 2/2014 | Breyta et al. |

OTHER PUBLICATIONS

Search Report and Written Opinion for co-pending DE Application No. 102015121909.3 dated Apr. 15, 2016 (10 pages).
C. Auth et al: "45NM High-K + Metal Gate Strain-Enhanced Transistors," IEEE 2008 Symposium on VLSI Technology, pp. 128-129.

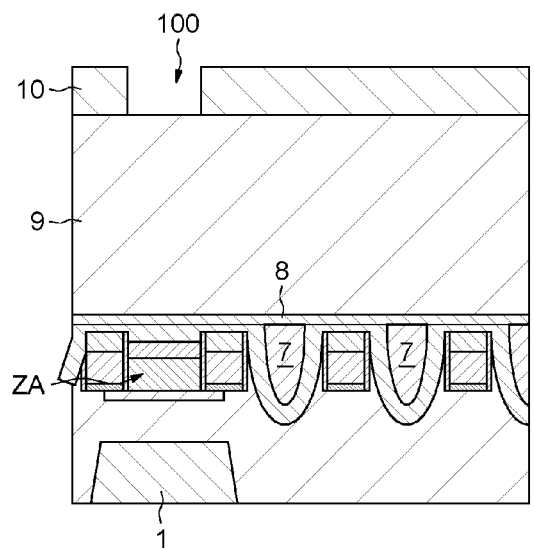
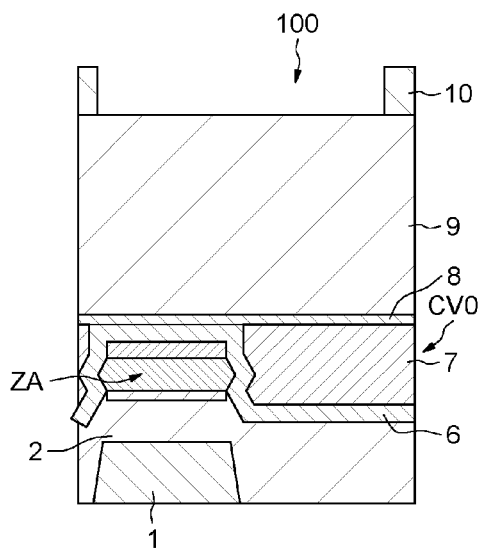
FIG.12  FIG.13
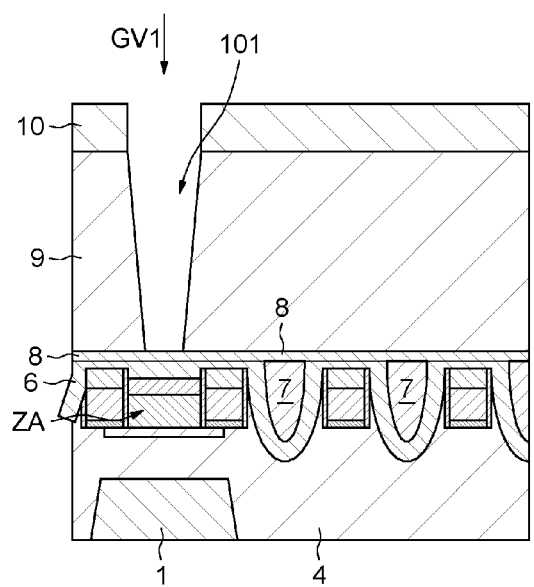
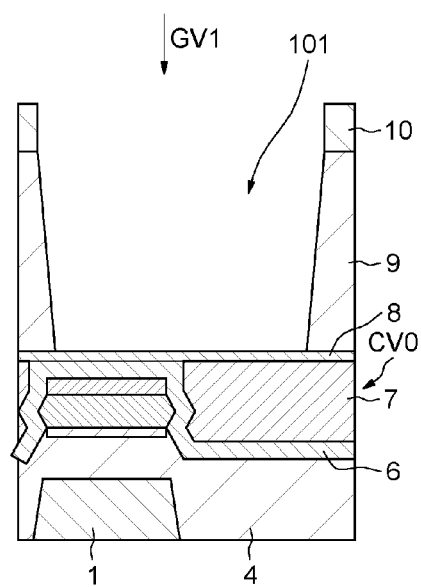
FIG.14  FIG.15

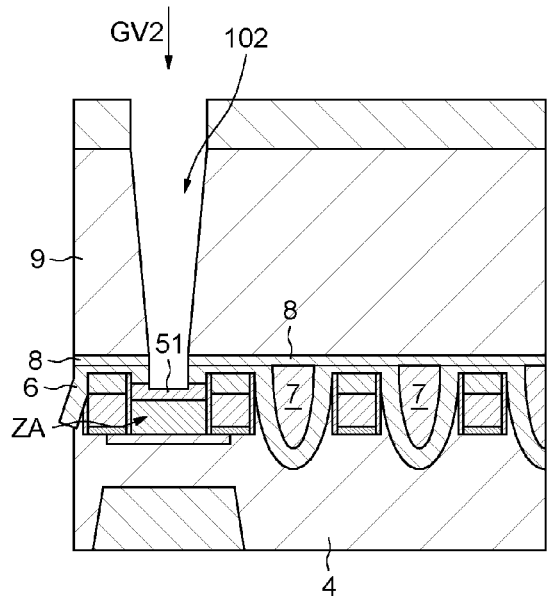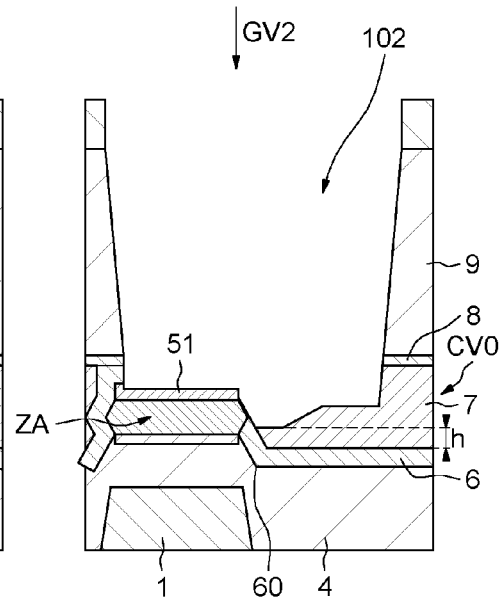
FIG.16  FIG.17
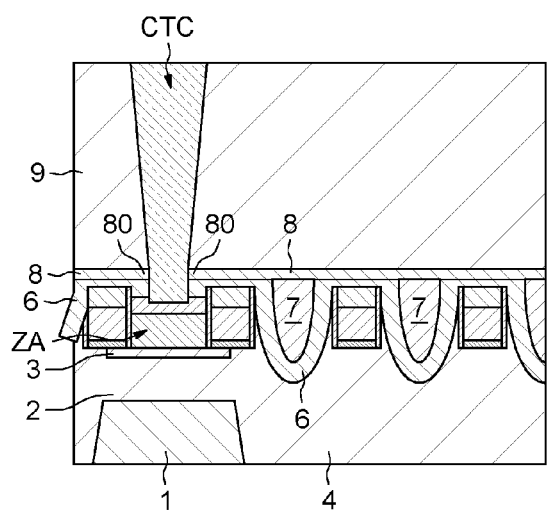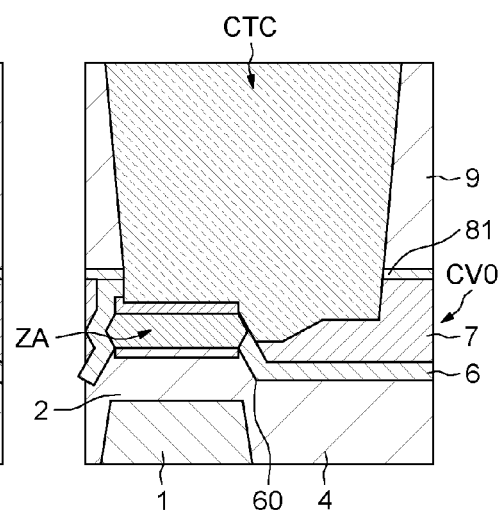
FIG.18  FIG.19

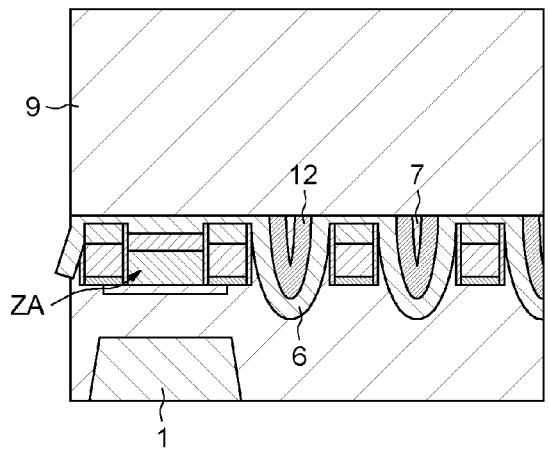
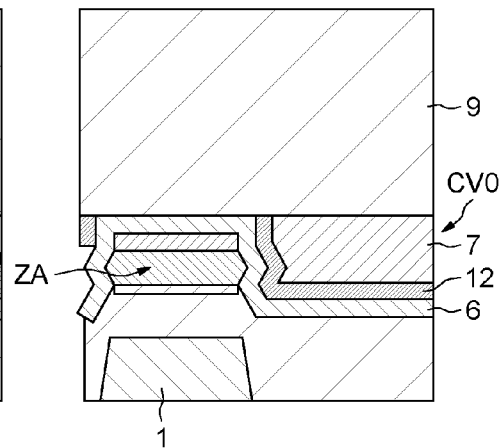
FIG.26  FIG.27
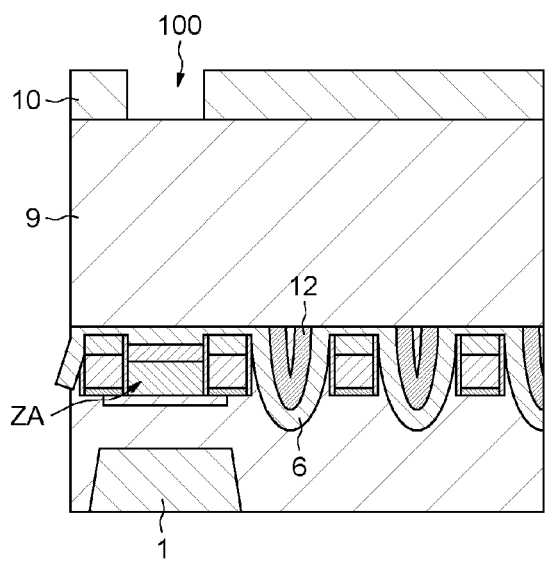
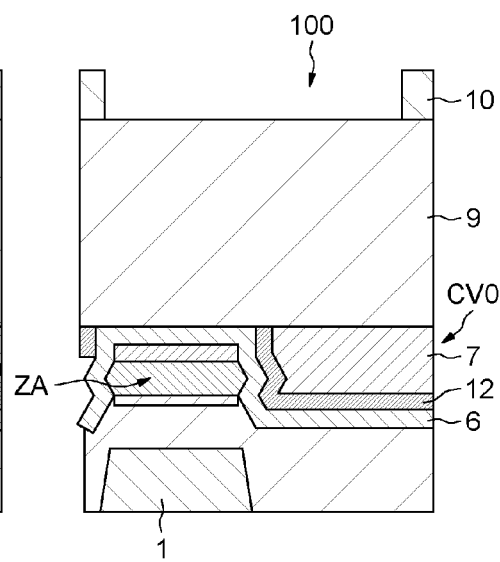
FIG.28  FIG.29

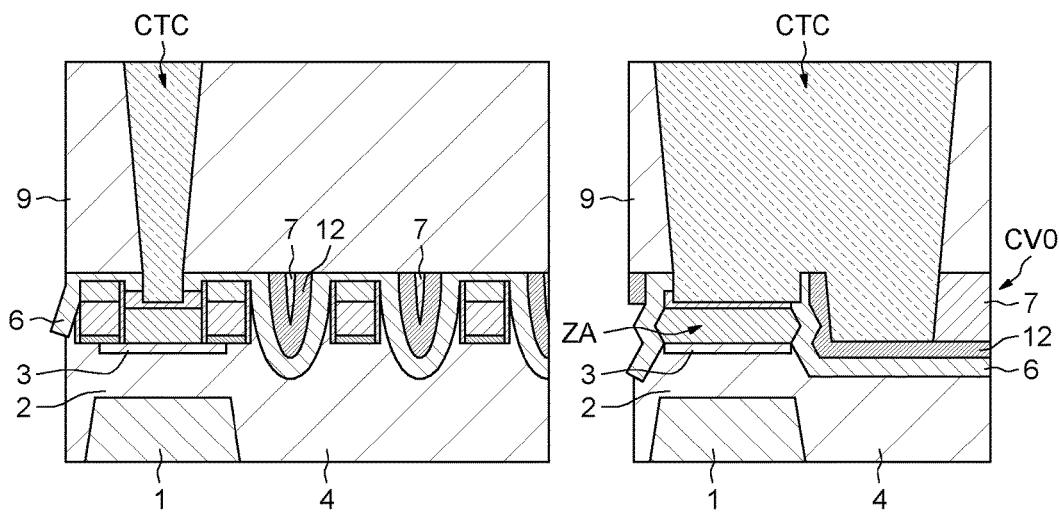

ized circuit, for example a source or drain zone of a transistor, projecting onto a cavity bordering this active zone, allowing the risk of a short-circuit forming between the end of the contact and a neighboring semiconductor region, for example a portion of a carrier substrate of an SOI substrate, to be removed while preferably using only a single photolithography mask to define the geometry of the contact.

PROCESS FOR PRODUCING A CONTACT ON AN ACTIVE ZONE OF AN INTEGRATED CIRCUIT, FOR EXAMPLE PRODUCED ON AN SOI SUBSTRATE, IN PARTICULAR AN FDSOI SUBSTRATE, AND CORRESPONDING INTEGRATED CIRCUIT

CROSS REFERENCE TO RELATED APPLICATIONS

This application is a divisional application from U.S. application patent Ser. No. 14/962,976 filed Dec. 8, 2015, which claims priority from French Application for Patent No. 1555588 filed Jun. 18, 2015, the disclosures of which are incorporated by reference.

TECHNICAL FIELD

The invention relates to integrated circuits, and more particularly to the production of contacts on the active zones of the integrated circuit, for example transistor drain or source zones, projecting over an insulating zone bordering these active zones.

BACKGROUND

The substrate on which the integrated circuit is produced may be a silicon-on-insulator (SOI) substrate and more particularly a fully depleted silicon-on-insulator (FDSOI) substrate, without these examples being limiting.

A silicon-on-insulator substrate comprises a semiconductor film, for example made of silicon or a silicon alloy, for example a silicon-germanium alloy, located on top of a buried insulating layer, commonly called a "BOX" (for "buried-oxide"), itself located on top of a carrier substrate, for example a semiconductor well.

In FDSOI technology, the semiconductor film is fully depleted, i.e. it is composed of intrinsic semiconductor material. It is generally about a few nanometers in thickness. Moreover, the buried insulating layer is itself generally thin, of about ten nanometers in thickness.

On account of the small thickness of the semiconductor film, the source and drain regions of transistors comprise segments that are raised relative to the semiconductor film, so as to ensure an adequate electrical connection between these regions and the channel region of the transistor.

Such raised source and drain regions (RSDs) are typically obtained by epitaxy.

In order to allow the raised source and drain zones to be produced by epitaxy, the surface of the silicon is cleaned beforehand, for example using a deoxidation process, this causing cavities to form in the neighboring insulating zone.

Moreover, in commonplace integration processes, when it is desired to produce a contact on an active zone located a small precisely controlled distance from a polysilicon line, for example located between two polysilicon lines, the use of a photolithography mask to define the geometry of the contact then leads to the production of a contact that projects over said insulating cavity.

Furthermore, in this case, the conventional production process of the contact leads to the cavity being pierced, then causing a short-circuit between the metal end of the contact and the neighboring portion of the carrier substrate.

One way of avoiding this piercing consists in using two photolithography masks to define the geometry of the contact so that the latter does not project from the active zone.

However, such a process is expensive to implement.

SUMMARY

According to one method of implementation, a process is proposed for producing a contact on an active zone of an integrated circuit, for example a source or drain zone of a transistor, projecting onto a cavity bordering this active zone, allowing the risk of a short-circuit forming between the end of the contact and a neighboring semiconductor region, for example a portion of a carrier substrate of an SOI substrate, to be removed while preferably using only a single photolithography mask to define the geometry of the contact.

According to one aspect, a process is provided for producing a contact on an active zone of an integrated circuit, the active zone lying above a semiconductor substrate that may be, for example, an SOI substrate comprising a semiconductor film borne by a buried insulating layer (BOX) itself borne by a carrier substrate.

The process according to this aspect comprises forming, above said active zone and in and above a cavity bordering the active zone and extending, in an insulating zone, as far as into the vicinity of a semiconductor region, for example a portion of the carrier substrate, an insulating multilayer.

The formation of this insulating multilayer comprises forming a first insulating layer, for example an etch stop layer i.e. the layer commonly referred to by those skilled in the art as the contact etch stop layer (CESL), covering the active zone and lining the walls of the cavity, and forming an insulating region, this region typically being the region referred to by those skilled in the art as the pre-metal dielectric (PMD), for example comprising silicon dioxide surmounted with a TEOS (tetraethylorthosilicate) oxide, on top of the first insulating layer.

The process also comprises an operation of etching a portion of the insulating multilayer so as to define an orifice opening onto the active zone and into the cavity, and filling the orifice with an electrically conductive filling material, for example copper, tungsten or aluminum.

According to one general feature of this aspect, the formation of said insulating region comprises, after the first insulating layer has been formed, forming an additional insulating layer configured to prevent, during said etching operation, a segment of the first insulating layer lining the walls of the cavity and located in proximity to said semiconductor region from being pierced.

According to one variant, the formation of the insulating region comprises: filling the cavity with a first insulating material, for example silicon dioxide, covering the portion of the first insulating layer lining the walls of the cavity; forming the additional insulating layer covering the first insulating layer and the first insulating material; and forming a second insulating layer, for example made of TEOS oxide, on the additional insulating layer.

According to one method of implementation applicable to this variant, the etching operation comprises a first etch of the second insulating layer stopped on the additional insulating layer, then a second etch configured to etch, on the one hand, the additional insulating layer and the subjacent first insulating layer so as to expose the active zone, and on the other hand, the additional insulating layer and a subjacent portion of the first insulating material located in the cavity, without piercing said segment of the first insulating layer.

Thus, the presence of this additional insulating layer on top of the cavity allows the first etch to be stopped on this additional insulating layer, thereby preserving a cavity filled with the first insulating material, and therefore makes it possible to stop the second etch a distance from the bottom of the cavity, thereby making it possible not to pierce the first insulating layer.

The material of the additional insulating layer may be identical to the material of the first insulating layer and, for example, comprise a silicon nitride.

The thickness of the additional insulating layer is advantageously chosen so that this additional insulating layer is thick enough to play its role as etch stop layer and thin enough not to disrupt the etch allowing the additional insulating layer and the first layer to be opened so as to expose the top of the active zone.

A person skilled in the art will be able to adjust this thickness depending especially on the materials and types of etch used.

This being so, a thickness comprised between 5 and 20 nm is considered to be an acceptable thickness.

According to another variant, the formation of the insulating region comprises: forming the additional insulating layer so that is covers the portion of the first insulating layer lining the walls of the cavity, the additional insulating layer being configured to be selectively etchable relative to the first insulating layer; filling the cavity with a first insulating material, for example silicon dioxide, covering the additional insulating layer; and forming a second insulating layer on the first insulating material, for example a layer of TEOS type oxide.

Thus, according to one method of implementation applicable to this other variant, the etching operation comprises a first etch of the second insulating layer stopped on the portion of the first insulating layer located above the active zone and on the additional insulating layer, then a second selective etch configured to etch the portion of the first insulating layer located above the active zone, so as to expose the active zone without etching the additional insulating layer lining the walls of the cavity.

By way of nonlimiting example, the first insulating layer may comprise a silicon nitride and the additional insulating layer may comprise a high dielectric constant oxide (high-k oxide), typically having a dielectric constant k higher than or equal to 15.

This dielectric may for example be chosen from the group formed by $HfO_2$, $ZrO_2$, $Al_2O_3$, MN, TiN and $TiO_2$.

According to another aspect, an integrated circuit is provided, comprising at least one active zone lying above a semiconductor substrate, a cavity bordering the active zone and extending, in an insulating zone, as far as into the vicinity of a semiconductor region, an insulating multilayer and an electrically conductive contact within the insulating multilayer emerging onto the active zone and into the cavity.

According to one general feature of this other aspect, the insulating multilayer comprises: a first insulating layer covering the active zone outside said contact, lining at least partially the walls of the cavity and possessing a segment located between said contact and said semiconductor region; and an insulating region on top of the first insulating layer comprising at least one insulating material around said contact and an additional insulating layer located possessing a first portion covering the first insulating layer outside said contact and a second portion located outside the contact, within said at least one insulating material and at a distance from the portion of the first insulating layer lining at least partially the walls of the cavity.

According to one embodiment, the material of the additional insulating layer may be identical to the material of the first insulating layer and for example comprise a silicon nitride.

The thickness of this additional insulating layer may be comprised between 5 and 20 nm.

As a variant, an integrated circuit is provided the insulating multilayer of which comprises: a first insulating layer covering the active zone outside said contact and lining the walls of the cavity; an additional insulating layer covering the portion of the first insulating layer lining the walls of said cavity, the contact reaching this additional insulating layer in said cavity; and an insulating region on top of the first insulating layer and of the additional insulating layer, comprising at least one insulating material around said contact.

According to one embodiment applicable to this variant, the first insulating layer comprises a silicon nitride and the additional insulating layer comprises a high dielectric constant oxide.

Whatever the variant, the semiconductor substrate may be an SOI substrate, i.e. a substrate comprising a semiconductor film borne by a buried insulating layer (BOX) itself borne by a carrier substrate. In this case, said buried insulating layer comprises at least one portion of said insulating zone and said semiconductor region may be a portion of the carrier substrate.

BRIEF DESCRIPTION OF THE DRAWINGS

Other advantages and features of the invention will become apparent on examining the detailed description of completely non-limiting methods of implementation and embodiments thereof and the appended drawings, in which:

FIGS. 1 to 35 schematically illustrate methods of implementation and embodiments.

DETAILED DESCRIPTION

Figure 1:
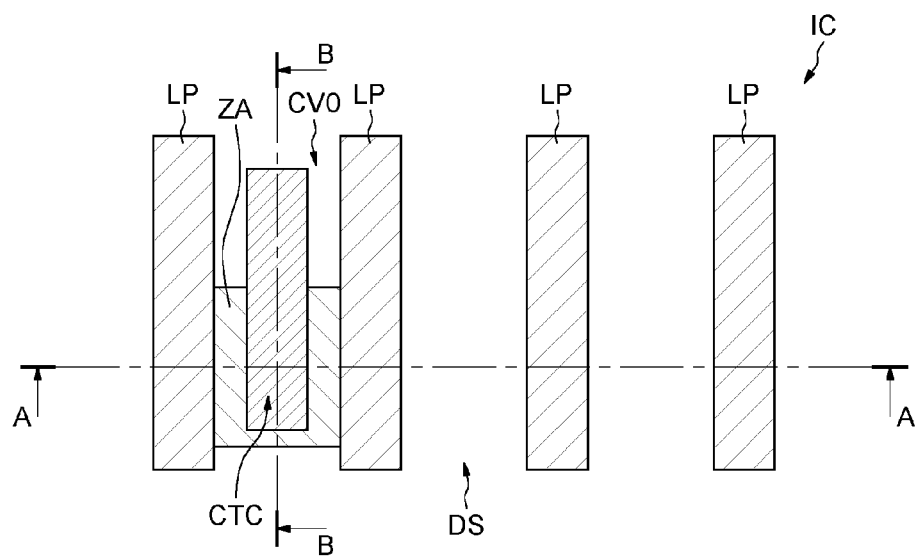

FIG. 1 schematically illustrates a top view of one portion of an integrated circuit IC comprising an active zone ZA here flanked by two polysilicon lines LP.

The active zone ZA may be a source or drain zone of a transistor the polysilicon line LP of which, located on the left in FIG. 1, then forms a gate region. In this case, another active zone will be present located on the other side of the polysilicon line LP and forming the drain or source region of the transistor.

This being so, generally, the active zone ZA may be any active zone, for example a zone allowing a contact to be made with a view to biasing the subjacent substrate.

In the example described here, the integrated circuit IC comprises a plurality of parallel polysilicon lines, the two lines on the right in FIG. 1 resting on an insulating zone DS and serving as patterns aiding with the photolithography of the gate regions.

Moreover, the contact CTC extends parallel to the polysilicon lines LP. It makes contact with the active zone ZA and projects from this active zone in the direction parallel to the polysilicon lines LP in order to overlap an insulating cavity CV0.

In the examples that will now be described, the integrated circuit is produced on an SOI substrate although the invention is not limited to this type of substrate.

Moreover, of the following figures, those of even number are schematic cross sections along the line AA in FIG. 1 whereas those of uneven number are schematic cross-sectional views along the line BB in FIG. 1.

A first variant of a process for producing the contact CTC will now be described in more detail with reference more particularly to FIGS. 2 to 19.

Figures 2, 3:
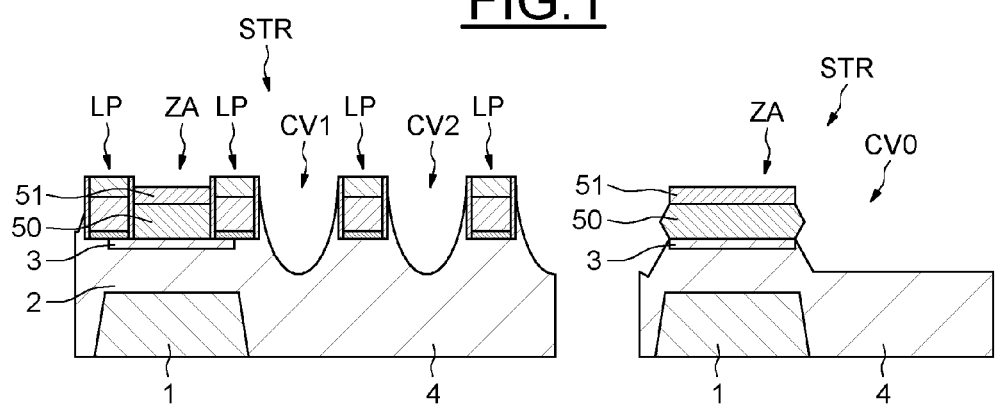

In FIGS. 2 and 3, the structure STR obtained after the conventional first phases of the integration process of the contact comprises, as indicated above, an SOI substrate comprising a semiconductor film 3 on a buried insulating layer 2 (BOX) itself borne by a subjacent semiconductor carrier substrate 1.

In the example described here, the zone 4 is a trench isolation zone, for example a shallow trench isolation (STI) zone.

The active zone ZA results from epitaxy of silicon 50 between the two polysilicon lines LP.

The preparation for this epitaxy requires cleaning treatments, generally wet treatments based on hydrofluoric acid (HF), which consume a certain amount of silicon oxide on all the exposed surfaces of the wafer, and especially in the insulating zones 4, between two polysilicon lines LP, thus causing cavities CV0, CV1, CV2 to form.

Moreover, the epitaxial region 50 and the polysilicon lines LP have undergone a siliciding treatment, the active zone thus comprising a zone 51 comprising a metal silicide, for example nickel silicide (NiSi).

It may be seen in FIG. 3 that the bottom of the cavity CV0, which borders the active zone ZA, neighbors a portion of the carrier substrate 1.

Figures 4, 5:
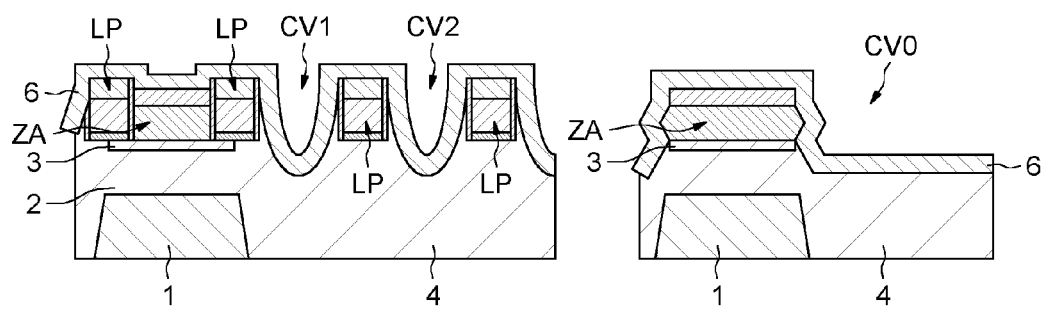

As illustrated in FIGS. 4 and 5, a first insulating layer 6, typically an etch stop layer made of silicon nitride (this layer commonly being designated the contact etch stop layer (CESL) by those skilled in the art) is deposited on the structure STR in FIGS. 2 and 3.

Figure 6:
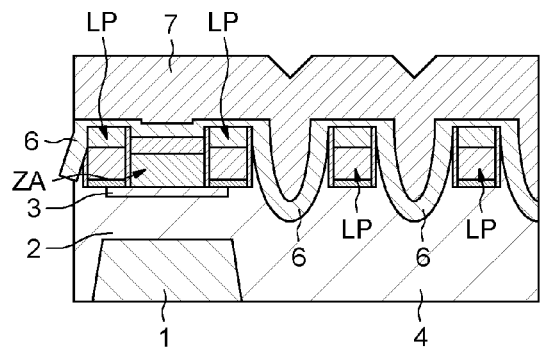
Figure 7:
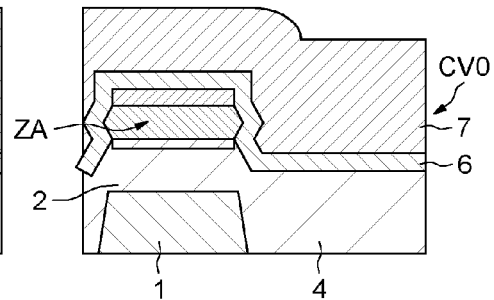

Next, as illustrated in FIGS. 6 and 7, a first insulating material 7, for example silicon dioxide, is deposited on this layer 6.

Figure 8:
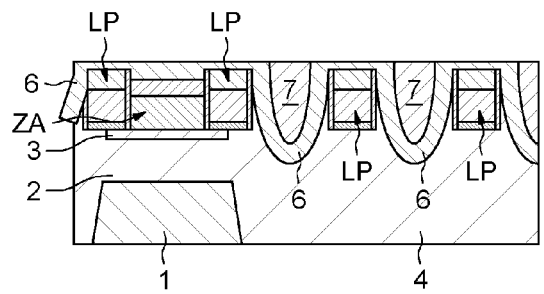
Figure 9:
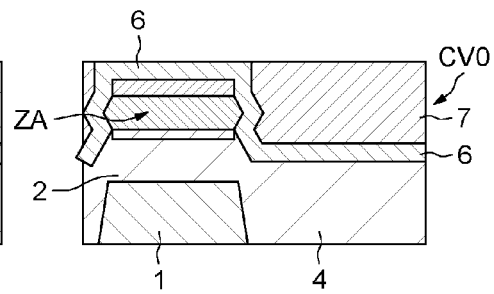

Next, a chemical-mechanical polish is carried out (FIGS. 8 and 9).

Figure 10:
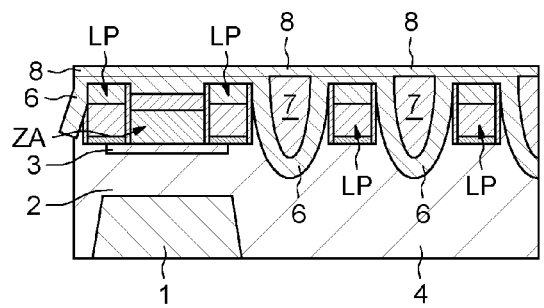
Figure 11:
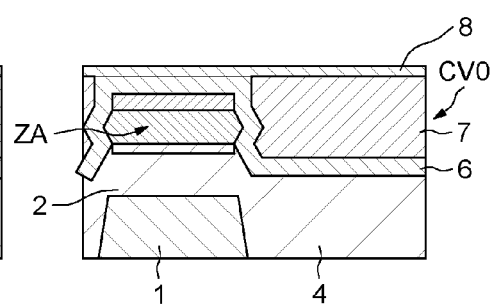

In the following step, illustrated in FIGS. 10 and 11, an additional insulating layer 8 is deposited on the first insulating layer 6 and on the first insulating material 7, the latter having especially filled the cavity CV0.

This additional insulating layer 8 may also be a layer of silicon nitride. As will be seen in more detail below, it will also serve as an etch stop layer.

Next, as illustrated in FIGS. 12 and 13, a second insulating material 9, for example a TEOS oxide, is deposited.

Next, in a conventional way known per se, an aperture 100 defining the geometry of the future contact CTC is produced in a mask 10.

Next, as illustrated in FIGS. 14 and 15, a first etch GV1 of the second insulating material 9 is carried out through the orifice 100 so as to define a first orifice 101 opening onto the additional insulating layer 8.

This first etch GV1 is stopped on the layer 8. By way of example, it is possible to use a reactive ion etch (RIE) with a fluorocarbon chemistry.

At this stage, on account of the presence of the additional insulating layer 8 above the cavity CV0, the etch GV1 has not etched the first insulating material 7 present in the cavity CV0, which would have been the case if this layer 8 were absent.

Next, as illustrated in FIGS. 16 and 17, a second etch GV2 is carried out allowing a portion of the layer 8 and of the layer 6 to be etched so as to expose the silicided zone 51 of the active zone ZA. Moreover, this etch GV2 also etches the layer 8 located above the cavity CV0 and consumes a portion of the first insulating material 7. This being so, after this etch GV2, there remains a height h, for example 40 nm, of a first insulating material 7 on top of the first insulating layer 6 lining the bottom of the cavity CV0.

This etch GV2 is also a conventional etch known per se, for example a reactive ion etch with a chemistry containing a gas such as $CH_xF_y$.

The additional insulating layer 8 is advantageously thick enough to be able to act as an etch stop layer for the etch GV1 and thin enough not to disrupt the etch GV2 and to allow the silicided zone 51 to be effectively exposed. A thickness comprised between 5 and 20 nm is an acceptable thickness. In practice, the additional insulating layer 8 has a thickness of about 10 nm.

Next, as illustrated in FIGS. 18 and 19, the orifice 102 obtained after the etch GV2 is filled with an electrically conductive filling material, for example copper, tungsten or aluminum. This filling is carried out in a conventional way by deposition followed by a chemical-mechanical polishing.

As may be seen in FIGS. 18 and 19, the integrated circuit here comprises an active zone ZA lying above the semiconductor substrate 3. A cavity CV0 borders the active zone ZA and extends, in an insulating zone 2, and possibly 4, as far as into the vicinity of a semiconductor region here formed by a portion of the carrier substrate 1. The electrically conductive contact CTC is located within an insulating multilayer and emerges onto the active zone ZA and into the cavity.

This insulating multilayer here comprises the first insulating layer 6 covering the active zone outside the contact CTC, lining at least partially the walls of the cavity CV0 and possessing a segment 60 located between the contact CTC and the semiconductor region 1.

The insulating multilayer also comprises an insulating region on top of the first insulating layer 6. This insulating region comprises the first insulating material 7 and the second insulating material 9, around the contact CTC, and the additional insulating layer 8. This additional insulating layer 8 possesses a first portion 80 covering the first insulating layer 6 outside the contact CTC and a second portion 81 here located between the insulating materials 7 and 9 and at a distance from the portion of the first insulating layer 6 that lines the walls of the cavity CV0.

To illustrate one variant of the invention, reference is now more particularly made to FIGS. 20 to 35.

The process according to this variant also starts with the steps illustrated in FIGS. 2 to 5.

Figure 20:
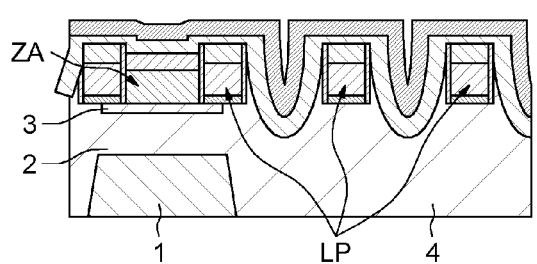
Figure 21:
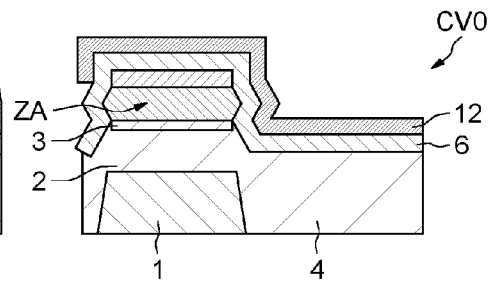

Then, as illustrated in FIGS. 20 and 21, an additional insulating layer 12 that covers the first insulating layer 6 is deposited on the structure illustrated in FIGS. 4 and 5.

This additional insulating layer 12 forms a barrier layer and it is selectively etchable relative to the first insulating layer 6. In other words, the additional insulating layer 12 is configured to not or almost not be etched during etching of the first insulating layer 6.

By way of indication, the first insulating layer 6 may comprise silicon nitride whereas the additional insulating layer 12 may comprise a dielectric material of high dielectric constant k, typically higher than 15. Such a dielectric may for example be $AlO_2$, $HfO_2$, MN, TiN or $TiO_2$, these examples not being limiting.

Figure 22:
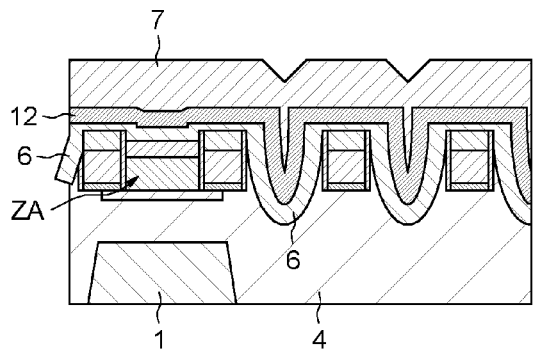
Figure 23:
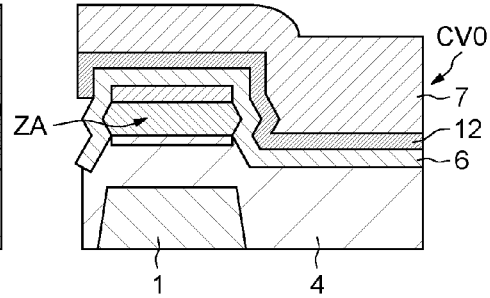
Figure 24:
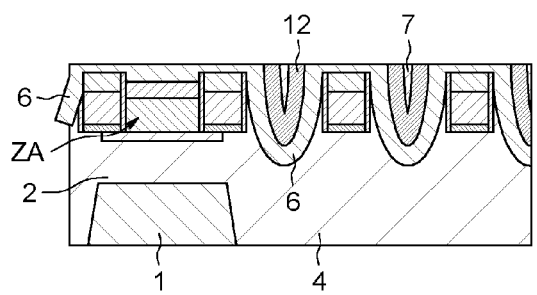
Figure 25:
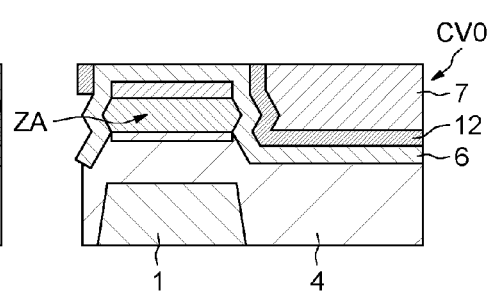

Next, as illustrated in FIGS. 22 and 23, the first insulating material 7 is deposited on this additional insulating layer 12. This deposition is followed by a chemical-mechanical polish allowing the structure illustrated in FIGS. 24 and 25 to be obtained. More precisely, the additional insulating layer 12 remains in the cavities but has been removed above other portions of the first insulating layer 6, in particular above the active zone ZA.

In this respect, the additional insulating layer 12 is advantageously thick enough to act as an etch stop layer and thin enough not to disrupt the chemical-mechanical polish.

A thickness comprised between 2 and 15 nm is an acceptable thickness. Typically, the thickness of the additional insulating layer 12 is about 6 nm.

Next, as illustrated in FIGS. 26 and 27, the second insulating material 9, typically TEOS oxide, is deposited. Next, in an analogous way to the way described above, the aperture 100 allowing the geometry of the contact CTC to be defined is formed in the mask 10 (FIGS. 28 and 29).

Next, an etch GV4 that is for example identical to the etch GV1 is carried out. This etch GV4 is stopped, on the one hand, on the first insulating layer 6 above the active zone ZA, and on the other hand, on the additional insulating layer 12 in the bottom of the cavity CV0.

Figure 30:
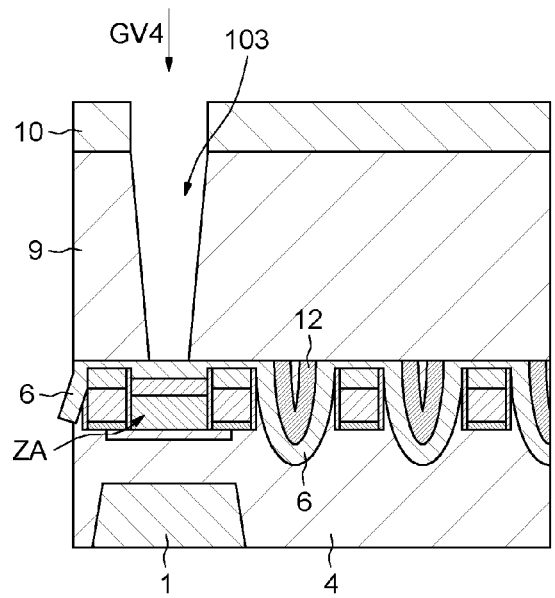
Figure 31:
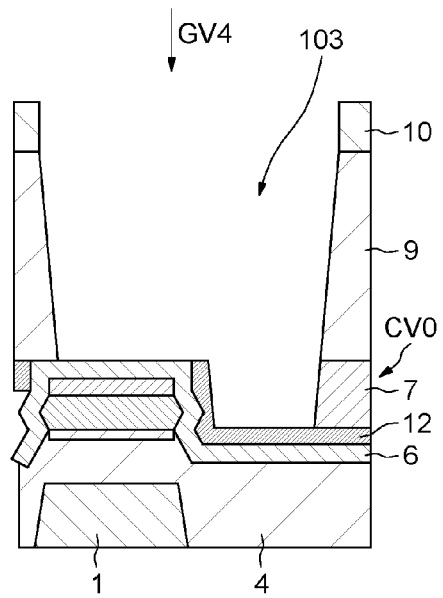

An orifice 103 is thus formed (FIGS. 30 and 31).

Next, an etch GV5 is carried out that allows the additional insulating layer 6 to be selectively etched without etching or almost without etching the additional insulating layer 12.

Such an etch GV5 is for example a reactive ion etch with a chemistry containing a gas such as $CH_xF_y$.

Figure 32:
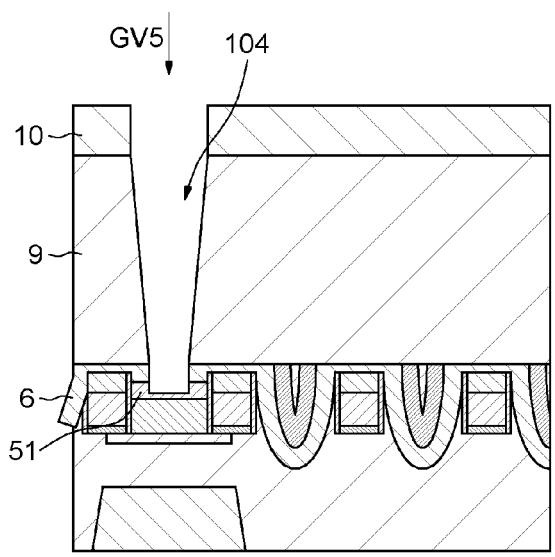
Figure 33:
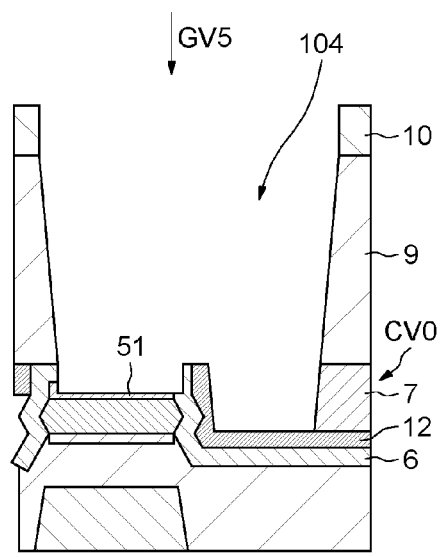

An orifice 104 opening onto the silicided zone 51 of the active zone ZA and opening onto the additional insulating layer 12 in the bottom of the cavity CV0 is then obtained (FIGS. 32 and 33).

Next, in an analogous way to the way described above, the orifice 104 is filled so as to form the electrically conductive contact CTC (FIGS. 34 and 35).

The presence of the additional insulating layer 12 in the bottom of the cavity CV0 thus makes it possible to avoid piercing the first insulating layer 6 and therefore a short circuit between the end of the contact CTC and the neighboring portion of the carrier substrate 1.

As may be seen in FIGS. 34 and 35, the insulating multilayer this time comprises the first insulating layer 6 covering the active zone ZA outside the contact CTC and lining the walls of the cavity CV0 and the additional insulating layer 12 covering the portion of the first insulating layer 6 that lines the walls of the cavity. The contact CTC has reached this additional insulating layer 12 in the cavity CV0.

Furthermore, in an analogous way to the way described above, the insulating multilayer moreover comprises an insulating region located on top of the first insulating layer 6 and of the additional insulating layer 12 and comprising the first insulating material 7 and the second insulating material 9 around the contact CTC.

The invention is not limited to the methods of implementation and embodiments just described but encompasses any variant.

The substrate may also be a bulk substrate bearing raised active regions.

The invention may apply to any type of transistor, especially planar MOS transistors, but also FinFET MOS transistors.

The invention claimed is:

1. An integrated circuit, comprising:
   at least one active zone lying above a semiconductor substrate,
   a cavity bordering the active zone and extending, in an insulating zone, into a vicinity of a semiconductor region of said active zone,
   an insulating multilayer; and
   an electrically conductive contact within the insulating multilayer electrically coupled to the active zone and emerging into the cavity, with the electrically conductive contact in physical contact with a lateral side surface of the active zone in said cavity where the insulating multilayer is not present,
   wherein the insulating multilayer comprises:
     a first insulating layer covering the active zone outside said contact and lining, at least partially, walls of the cavity and possessing a segment located between said electrically conductive contact and said semiconductor region which does not insulate the lateral side surface of the active zone where the electrically conductive contact makes physical contact,
     an insulating region on top of the first insulating layer comprising at least one insulating material around said electrically conductive contact, and
     an additional insulating layer possessing a first portion covering the first insulating layer outside said electrically conductive contact and a second portion located outside the electrically conductive contact within said at least one insulating material and at a distance from the portion of the first insulating layer lining at least partially the walls of the cavity.

2. The integrated circuit according to claim 1, wherein a material of the additional insulating layer is identical to a material of the first insulating layer.

3. The integrated circuit according to claim 2, wherein the additional insulating layer and the first insulating layer comprise a silicon nitride.

4. The integrated circuit according to claim 1, wherein a thickness of the additional insulating layer is between 5 and 20 nanometers.

5. The integrated circuit according to claim 1, wherein said semiconductor substrate is a semiconductor film borne by a buried insulating layer itself borne by a carrier substrate, said buried insulating layer comprising at least one portion of said insulating zone, said semiconductor region being a portion of said carrier substrate.

6. The integrated circuit of claim 1, wherein a bottommost surface of the electrically conductive contact is positioned at a height which is lower than a height of the silicide.

7. An integrated circuit, comprising:
   at least one active zone lying above a semiconductor substrate,
   a cavity bordering the active zone and extending, in an insulating zone, into a vicinity of a semiconductor region,
   an insulating multilayer, and
   an electrically conductive contact within the insulating multilayer electrically coupled to the active zone and emerging into the cavity,
   wherein the insulating multilayer comprises:
     a first insulating layer covering the active zone outside said contact, lining a lateral side surface of the active zone and lining the walls of the cavity,
     an additional insulating layer covering the portion of the first insulating layer lining the lateral side surface of the active zone and lining the walls of said cavity, the electrically conductive contact reaching this additional insulating layer in said cavity with the first insulating layer and additional insulating layer laterally separating a bottom portion of the electrically conductive contact from the lateral side surface of the active zone, and
     an insulating region on top of the first insulating layer and the additional insulating layer comprising at least one insulating material around said electrically conductive contact.

8. The integrated circuit according to claim 7, wherein the first insulating layer comprises a silicon nitride and the additional insulating layer comprises a high dielectric constant oxide.

9. The integrated circuit according to claim 7, wherein said semiconductor substrate is a semiconductor film borne by a buried insulating layer itself borne by a carrier substrate, said buried insulating layer comprising at least one portion of said insulating zone, said semiconductor region being a portion of said carrier substrate.

10. The integrated circuit of claim 7, wherein a bottommost surface of the bottom portion of the electrically conductive contact is positioned at a height which is lower than a height of the active zone.

11. An integrated circuit, comprising:
an active semiconductor zone;
a silicide on a top of said active semiconductor zone;
a first insulating layer on top of said silicide and extending onto a lateral side surface of said active semiconductor zone;
a second insulating layer on top of said first insulating layer in a region laterally adjacent to a portion of the first insulating layer which extends onto a first portion of the lateral side surface of said active semiconductor zone;
a third insulating layer on top of said second insulating layer in said region and further on top of said first insulating layer over the silicide;
a fourth insulating layer on top of said third insulating layer;
an electrically conductive contact extending through the first, second, third and fourth insulating layers to make physical contact with both the silicide and a second portion of the lateral side surface of said active semiconductor zone that is not covered by said first insulating layer.

12. The integrated circuit of claim 11, wherein a bottommost surface of the electrically conductive contact is positioned in said region at a height which is lower than a height of the silicide.

13. An integrated circuit, comprising:
an active semiconductor zone;
a silicide on a top of said active semiconductor zone;
a first insulating layer on top of said silicide and extending onto a lateral side surface of said active semiconductor zone;
a second insulating layer on top of said first insulating layer in a region laterally adjacent to a portion of the first insulating layer which extends onto the lateral side surface of said active semiconductor zone;
a third insulating layer on top of said second insulating layer in said region;
a fourth insulating layer on top of said third insulating layer in said region and further on top of said first insulating layer over the silicide;
an electrically conductive contact extending through the first, second, third and fourth insulating layers to make physical contact with the silicide, wherein the portion of the first insulating layer and a portion of the second insulating layer are laterally positioned between a bottom portion of the electrically conductive contact and the lateral side surface of said active semiconductor zone.

14. The integrated circuit of claim 13, wherein a bottommost surface of the bottom portion of the electrically conductive contact is positioned in said region at a height which is lower than a height of the silicide.

15. An integrated circuit, comprising:
an active semiconductor zone;
a silicide on a top of said active semiconductor zone;
a first insulating layer on top of said silicide and extending onto a lateral side surface of said active semiconductor zone;
a second insulating layer on top of said first insulating layer in a region laterally adjacent to a portion of the first insulating layer which extends onto a first portion of the lateral side surface of said active semiconductor zone;
a third insulating layer on top of said second insulating layer in said the region laterally adjacent and further on top of said first insulating layer over the silicide;
a fourth insulating layer on top of said third insulating layer;
an opening extending in the first, second, third and fourth insulating layers to expose a portion of the silicide and a second portion of the lateral side surface of said active semiconductor zone that is not covered by said first insulating layer; and
an electrically conductive contact that completely fills said opening to make physical contact with both the portion of the silicide and the second portion of the lateral side surface of said active semiconductor zone.

16. An integrated circuit, comprising:
an active semiconductor zone;
a silicide on a top of said active semiconductor zone;
a first insulating layer on top of said silicide and extending onto a lateral side surface of said active semiconductor zone;
a second insulating layer on top of said first insulating layer in a region laterally adjacent to a portion of the first insulating layer which extends onto the lateral side surface of said active semiconductor zone;
a third insulating layer on top of said second insulating layer in said region laterally adjacent to the portion of the first insulating layer which extends onto the side surface of said active semiconductor zone;
a fourth insulating layer on top of said third insulating layer in said the region laterally adjacent and further on top of said first insulating layer over the silicide;
an opening including a first portion extending in the first and fourth insulating layers to expose a portion of the silicide and a second portion extending in the third and fourth insulating layers; and
an electrically conductive contact that completely fills said opening to form a first contact portion that makes physical contact with the portion of the silicide and a second contact portion laterally adjacent the active semiconductor zone but which is laterally separated from the active semiconductor zone and the first contact portion by the first and second insulating layers.

\* \* \* \* \*

UNITED STATES PATENT AND TRADEMARK OFFICE
CERTIFICATE OF CORRECTION

PATENT NO. : 9,922,871 B2
APPLICATION NO. : 15/401896
DATED : March 20, 2018
INVENTOR(S) : Emmanuel Petitprez Page 1 of 1

It is certified that error appears in the above-identified patent and that said Letters Patent is hereby corrected as shown below:

In the Specification

At Column 3, Line 41, please replace the term [[ MN ]] with -- A1N --.
At Column 6, Line 52, please replace the term [[ MN ]] with -- A1N --.

Signed and Sealed this
Tenth Day of July, 2018

Andrei Iancu
*Director of the United States Patent and Trademark Office*